(12) United States Patent
Hashimoto et al.

(10) Patent No.: US 11,450,731 B2
(45) Date of Patent: Sep. 20, 2022

(54) SEMICONDUCTOR DEVICE

(71) Applicant: RENESAS ELECTRONICS CORPORATION, Tokyo (JP)

(72) Inventors: Chiemi Hashimoto, Tokyo (JP); Kosuke Yayama, Tokyo (JP); Hidekazu Tawara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 60 days.

(21) Appl. No.: 17/154,775

(22) Filed: Jan. 21, 2021

(65) Prior Publication Data
US 2021/0257443 A1 Aug. 19, 2021

(30) Foreign Application Priority Data
Feb. 17, 2020 (JP) .............................. JP2020-024173

(51) Int. Cl.
| | |
|---|---|
| *H01L 27/06* | (2006.01) |
| *H01L 49/02* | (2006.01) |
| *H03B 5/24* | (2006.01) |
| *H01F 7/06* | (2006.01) |
| *H01L 23/522* | (2006.01) |

(52) U.S. Cl.
CPC .............. *H01L 28/20* (2013.01); *H01F 7/064* (2013.01); *H01L 23/5228* (2013.01); *H01L 27/0611* (2013.01); *H03B 5/24* (2013.01)

(58) Field of Classification Search
CPC ....................................................... H01L 28/20
USPC ......................................................... 361/160
See application file for complete search history.

(56) References Cited

U.S. PATENT DOCUMENTS

| | | | |
|---|---|---|---|
| 2006/0098478 A1* | 5/2006 | Ezaki | H01L 27/226 365/158 |
| 2018/0375497 A1* | 12/2018 | Hashimoto | H03K 3/356113 |
| 2019/0252444 A1* | 8/2019 | Ryoki | H01L 27/14607 |
| 2020/0076409 A1* | 3/2020 | Hashimoto | H01L 28/20 |

FOREIGN PATENT DOCUMENTS

JP          2019-009345 A        1/2019

\* cited by examiner

*Primary Examiner* — Joseph Chang
(74) *Attorney, Agent, or Firm* — McDermott Will & Emery LLP

(57) ABSTRACT

A resistance element includes a conductor, the conductor having a repeating pattern of: a first conductive layer formed on a first interlayer insulating layer on a semiconductor substrate; a second conductive layer formed on a second interlayer insulating layer different from the first interlayer insulating layer; and an interlayer conductive layer connecting the first conductive layer and the second conductive layer, and the second conductive layer has a resistance-value fluctuation characteristic opposite to a resistance-value fluctuation characteristic of the first conductive layer after a heat treatment.

13 Claims, 15 Drawing Sheets

SEMICONDUCTOR DEVICE

CROSS-REFERENCE TO RELATED APPLICATION

The present application claims priority from Japanese Patent Application No. 2020-024173 filed on Feb. 17, 2020, the content of which is hereby incorporated by reference into this application.

TECHNICAL FIELD OF THE INVENTION

The present invention relates to a semiconductor device having a trimming circuit using a resistance element.

BACKGROUND

A semiconductor device in which an oscillation circuit is built is generally equipped with a trimming circuit for trimming frequency characteristics of the oscillation circuit. The trimming circuit has a resistance element, and the oscillation frequency of the oscillation circuit is set to a desired value by adjusting a resistance value of the resistance element. A polysilicon resistor is known as a resistance element used in the trimming circuit. The polysilicon resistor can be formed without complicating a manufacturing process of a semiconductor device, has a high resistivity, and is excellent in that high resistance can be realized in a small area. However, it is known that a resistance value of the polysilicon resistor fluctuates in the manufacturing process of the semiconductor device.

Patent Document 1 (JP 2019-9345 A1) discloses a technique for reducing resistance-value fluctuations in a mold packaging process. A polysilicon resistor on a silicon chip receives a stress from a mold resin, which causes its resistance value to fluctuate due to shape changes, piezoelectric effects, and the like. Patent Document 1 discloses a structure of a resistance element formed by connecting a lower conductive layer formed in a lower wiring layer and an upper conductive layer formed in an upper wiring layer through a via, in which a resistance material such as metal or polysilicon is embedded, since a package stress does not occur in a direction perpendicular to a surface of a semiconductor substrate.

SUMMARY

The frequency of the oscillation circuit differs depending on frequency accuracy required by an application used. In order to apply it to more applications, a more accurate trimming circuit is required. Therefore, it is desired to further reduce a resistance fluctuation rate of the resistance element included in the trimming circuit.

The resistance element described in Patent Document 1 has a structure in which resistance-value fluctuations before and after the mold packaging process are unlikely to occur, but a factor of the resistance-value fluctuations is not only a package stress. For example, the resistance-value fluctuations occur also by heat applied during an assembly of the semiconductor device. Also in view of characteristic fluctuations of other elements such as transistors in the oscillation circuit provided in the semiconductor device, it is desirable to reduce the resistance-value fluctuations of the resistance element of the trimming circuit as much as possible.

Other problems and novel features will become apparent from descriptions of the present specification and the accompanying drawings.

According to one embodiment, a resistance element has a repeating pattern of: a first conductive layer formed on a first wiring layer on a semiconductor substrate; a second conductive layer formed on a second wiring layer different from the first wiring layer; and an interlayer conductive layer connecting the first conductive layer and the second conductive layer, and the first conductive layer has a resistance-value fluctuation characteristic opposite to a resistance-value fluctuation characteristic of the second conductive layer after a heat treatment.

A semiconductor device according to an embodiment can suppress the resistance-value fluctuations of the resistance element.

DETAILED DESCRIPTION

Figure 1:
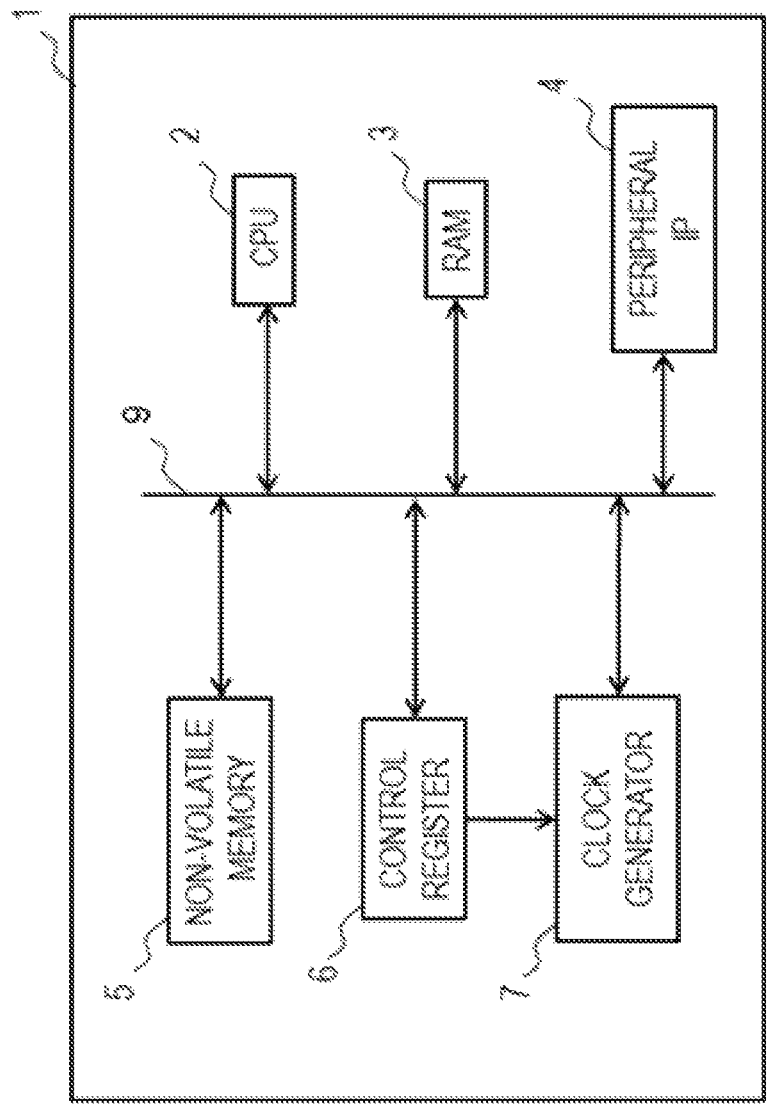
FIG. 1 is a block diagram of a semiconductor device according to a first embodiment.

Hereinafter, a semiconductor device according to an embodiment will be described in detail with reference to the drawings. Incidentally, in the specification and drawings, the same constituent requirements or the corresponding constituent requirements are denoted by the same reference numerals, and a duplicate description thereof will be omitted. Further, in the drawings, calibration may be omitted or simplified for convenience of explanation. Furthermore, at least some of the respective embodiments may be arbitrarily combined with each other.

First Embodiment

FIG. 1 shows a block diagram of a semiconductor device 1 according to the present embodiment. Active elements such as transistors and passive elements such as resistors and capacitors are formed on a substrate of the semiconductor device 1. Various functional blocks are formed in the semiconductor device 1 by using these elements. FIG. 1 shows a CPU (Central Processing Unit) 2, a RAM (Random Access Memory) 3, a peripheral IP4, and a non-volatile memory 5 as an example of the functional blocks. The peripheral IP is, for example, an A/D converter. These functional blocks exchange addresses and data via a bus 9. A clock generation circuit (clock generator) 7 includes anon-chip oscillator described later, generates a clock signal from an oscillation signal of the on-chip oscillator, and distributes the clock signal to these functional blocks through the bus 9. The on-chip oscillator has a trimming resistor although being described in detail later. An oscillation frequency of the on-chip oscillator is set by adjusting a resistance value of the trimming resistor. A trimming code(s) required for trimming is stored in the non-volatile memory 5 or the RAM 3. A resistance value of the trimming resistor is adjusted to a predetermined value based on the trimming code read through a control register 6.

Figure 2:
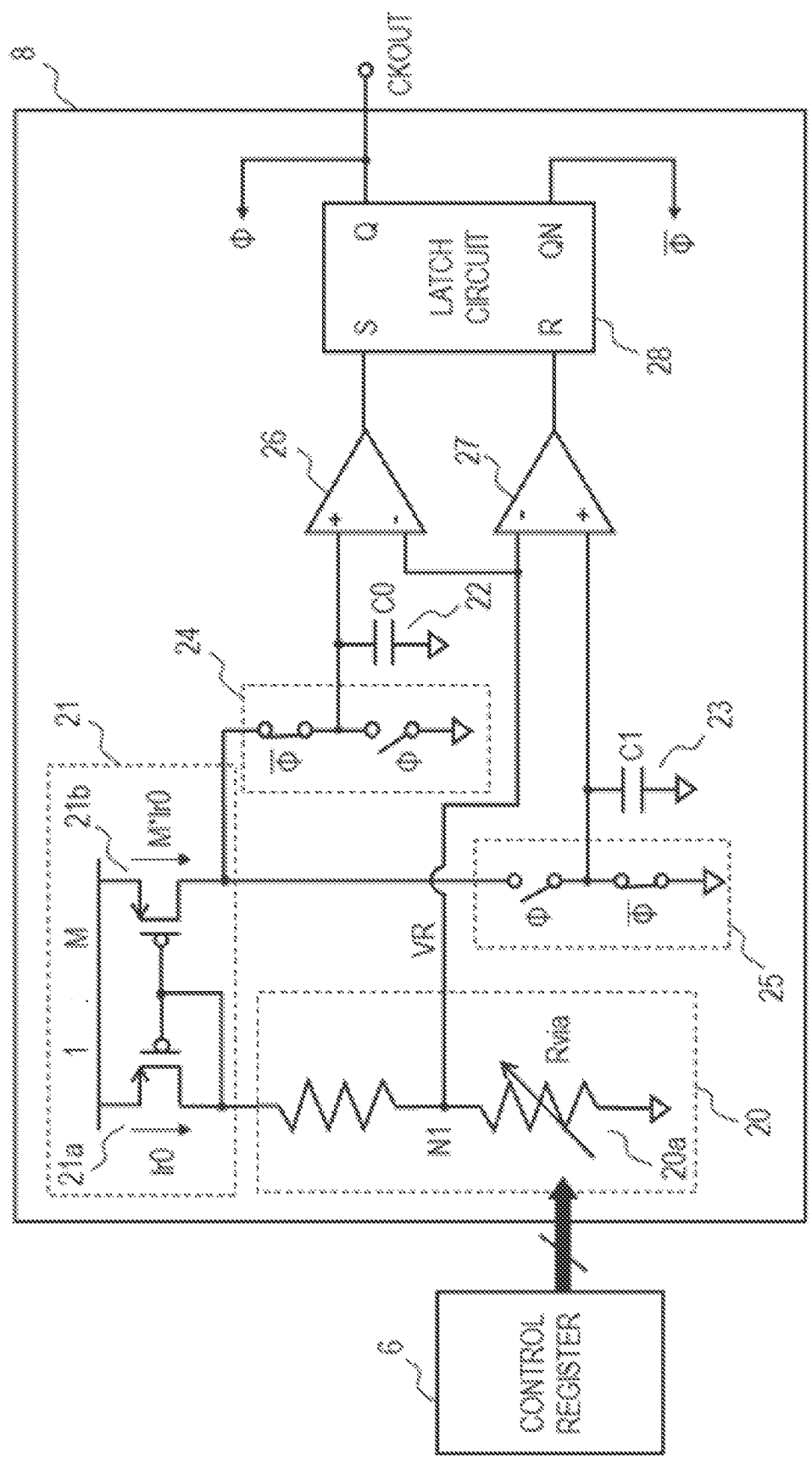
FIG. 2 is a circuit diagram of an oscillation circuit according to the first embodiment.

FIG. 2 shows a circuit diagram of an oscillation circuit 8 which is an example of the on-chip oscillator. The oscillation circuit 8 includes a trimming circuit 20, a constant current generation circuit 21, capacitors (hereinafter referred to as capacitances) 22, 23, capacitance drive circuits 24, 25, comparators 26, 27, and a latch circuit 28.

The constant current generation circuit 21 has a current mirror circuit including a PMOS transistor 21a and a PMOS transistor 21b. A transistor size of the PMOS transistor 21b is M times larger that of the PMOS transistor 21a. Therefore, assuming that a current flowing through paths of a source and a drain of the PMOS transistor 21a is Ir0, an output current M×Ir0 is outputted from the drain of the PMOS transistor 21b.

The latch circuit 28 has an output terminal Q and an output terminal QN. An oscillation signal Φ outputted from the output terminal Q is an output CKOUT of the oscillation circuit 8. An oscillation signal /Φ that is a phase opposite to the oscillation signal Φ is outputted from the output terminal QN. The oscillation signal Φ and the oscillation signal /Φ are inputted to the capacitance drive circuits 24 and 25. The capacitances 22 and 23 are alternately discharged to a reference potential (GND) level by using the capacitance drive circuits 24 and 25, and are alternately charged with the output current M×Ir0 from the PMOS transistor 36. By this charge, a potential VR of a reference potential point N1 of the trimming circuit 20 rises, and the outputs of the comparators 26 and 27 are inverted depending on the potential VR. As a result, a phase of the oscillation signal Φ (oscillation signal /Φ) is inverted. By repeating this, an oscillation signal having a predetermined frequency is outputted.

The trimming circuit 20 has a variable resistor 20a. The potential VR of the reference potential point N1 of the trimming circuit 20 is adjusted by setting a resistance value Rvia of the variable resistance 20a depending on the trimming code stored in the control register 6. From the following (Equation 1), it can be seen that an oscillation frequency $F_{CKOUT}$ of the oscillation circuit 8 is determined by capacitance values C0 and C1 of the capacitances 22 and 23, the resistance value Rvia of the variable resistor 20a, and a mirror ratio M. Incidentally, it is assumed that a high-level period in the oscillation output of the oscillation circuit 8 is TH and a low-level period therein is TL.

$$VR = Ir0 \times Rvia \quad \text{(Equation 1)}$$
$$M \times Ir0 \times T_H = C0 \times VR$$
$$M \times Ir0 \times T_L = C1 \times VR$$
$$\begin{aligned} F_{CKOUT} &= 1/(TH + TL) \\ &= M \times Ir0 / ((C0 + C1) \times VR) \\ &= M / ((C0 + C1) \times VR). \end{aligned}$$

Therefore, it can be seen that the fluctuation of Rvia affects the accuracy of the oscillation frequency $F_{CKOUT}$.

Figure 3:
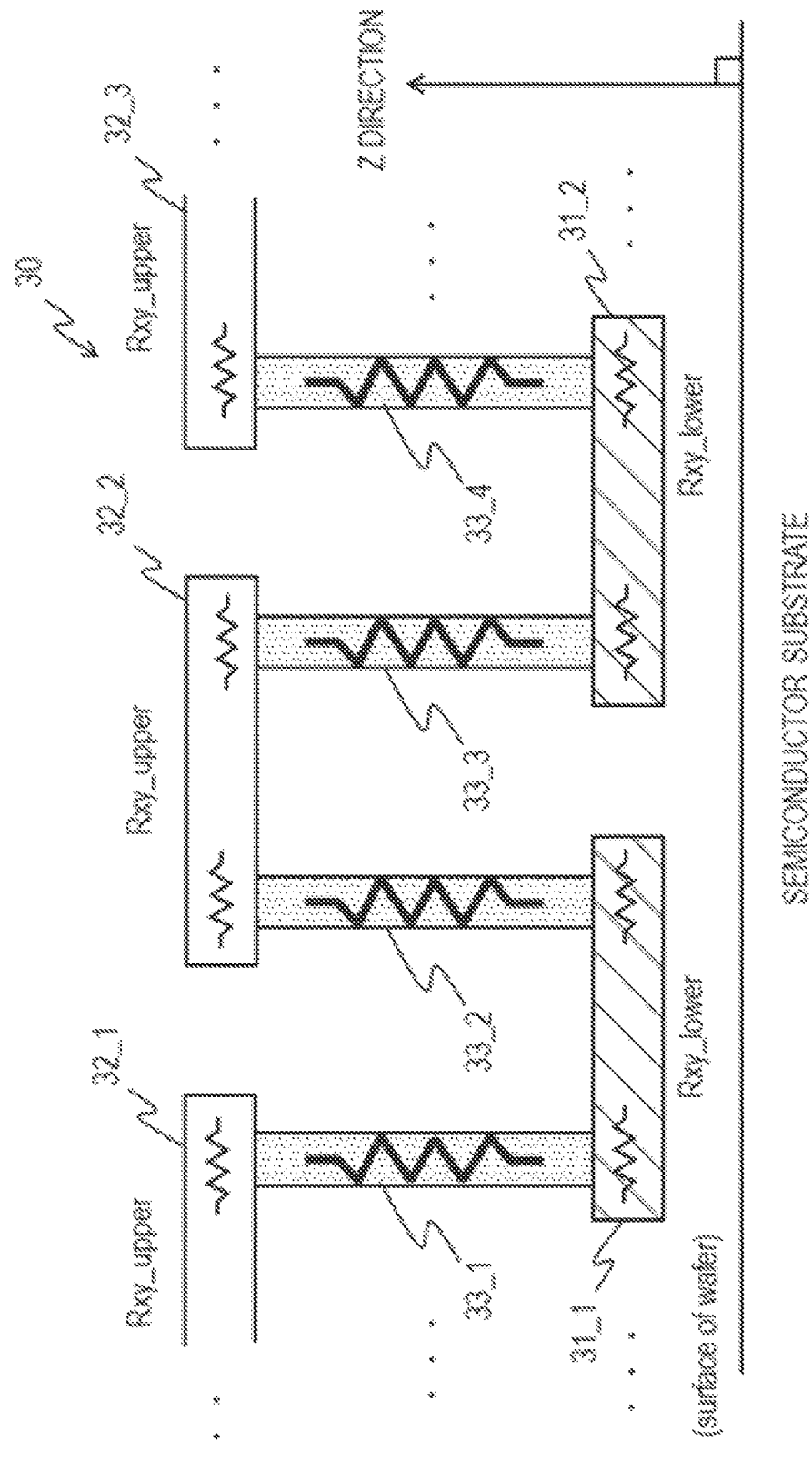
FIG. 3 is a conceptual diagram of a resistance element according to the first embodiment.

FIG. 3 shows a conceptual diagram of a resistance element 30 used for the variable resistor 20a in the present embodiment. It is assumed that a surface of a semiconductor substrate on which the semiconductor element is formed is defined as a XY plane and a direction perpendicular to the XY plane is defined as a Z direction. The resistance element 30 shown in FIG. 3 is a conductor including: a plurality of lower conductive layer patterns 31_1, 31_2, . . . ; a plurality of upper conductive layer patterns 32_1, 32_2, 32_3; . . . , and a plurality of interlayer conductive layers 33_1, 33_2, 33_3, 33_4, . . . . When the plurality of lower conductive layer patterns 31_1, 31_2, . . . are referred to without distinction, they are simply referred to as a lower conductive layer 31. Similarly, when the plurality of upper conductive layer patterns 32_1, 32_2, 32_3, . . . are referred to without distinction, they are simply referred to as an upper conductive layer 32. Further, when the plurality of interlayer conductive layers 33_1, 33_2, 33_3, 33_4, . . . are referred to without distinction, they are simply referred to as an interlayer conductive layer 33.

The lower conductive layer 31 and the upper conductive layer 32 extend in an X direction or a Y direction of the surface of the semiconductor substrate. The interlayer conductive layer 33 extends in the Z direction, and both ends thereof are connected to the lower conductive layer 31 and the upper conductive layer 32, respectively. For example, as shown in FIG. 3, the upper conductive layer pattern 32_1 and the lower conductive layer pattern 31_1 are connected by the interlayer conductive layer 33_1, and the lower conductive layer pattern 31_1 and the upper conductive layer pattern 32_2 are connected by the interlayer conductive layer 332. Since the resistance element 30 is formed by utilizing a structure of the wiring layer, each resistance value of the conductive layers configuring the resistance element is relatively small. Therefore, as shown in FIG. 3, a resistance element 30 having a desired resistance value as the resistance element 30 is realized by repeating a structure in which the lower conductive layer 31, the interlayer conductive layer 33, and the upper conductive layer 32 are connected in series.

Figure 4:
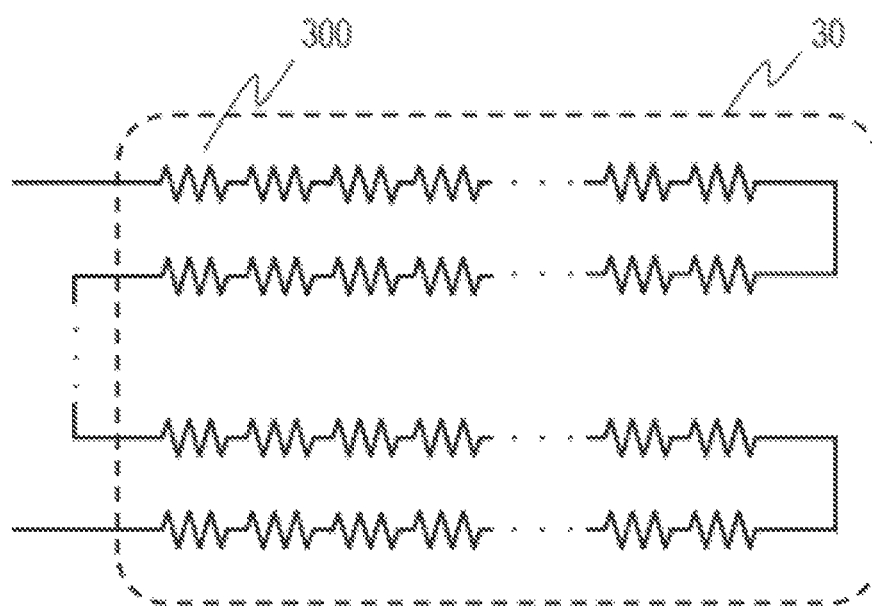
FIG. 4 is a circuit diagram of the resistance element according to the first embodiment.

FIG. 4 is a circuit diagram of the resistance element 30. One unit of the repeating pattern of the lower conductive layer 31, interlayer conductive layer 33, and upper conductive layer 32 configuring the resistance element 30 is shown as a pseudo unit resistance 300 in FIG. 4. As shown in FIG. 4, the resistance element is composed of a plurality of unit resistors 300 connected in series.

Here, it is assumed that k+1 lower conductive layers 31, k upper conductive layers 32, and 2k interlayer conductive layers 33 are connected in series. A resistance value of one lower conductive layer 31 is Rxy_lower, a resistance value of one upper conductive layer 32 is Rxy_upper, a resistance value of one interlayer conductive layer 33 is Rz, and a resistance value R of the resistance element 30 is expressed as:

$$R=(k+1) \times Rxy\_\text{lower}+2k \times Rz+k \times Rxy\_\text{upper}.$$

This is represented by a resistance value when the resistance element is connected to another element by the lower conductive layer 31. When the upper conductive layer pattern 32 is connected to another element, the resistance value R of the resistance element 30 is expressed as:

$$R=k \times Rxy\_\text{lower}+2k \times Rz+(k+1) \times Rxy\_\text{upper}.$$

In either case, a Z-direction component of the resistance element is main resistance, and it is assumed that the following relationship:

$$Rz >> Rxy\_\text{lower}+Rxy\_\text{upper}$$

is satisfied. The resistance element formed in the wiring layer and having the Z-direction component as the main resistance is hardly affected by the package stress. Therefore, by adopting the resistance element having such a structure, the resistance-value fluctuations before and after the mold package process are reduced.

Meanwhile, metal used for the lower conductive layer 31 and the upper conductive layer 32 has the resistance-value fluctuations caused due to aging. The aging is a phenomenon in which various properties (here, resistance value) of metal is changed with a lapse of time. The semiconductor device is formed through a process (heat treatment) in which heat is applied after the package process. This heat treatment includes, for example, a step of drying the semiconductor device (generally called a baking treatment) to prevent expansion and corrosion due to moisture absorption when the semiconductor device is stored until its shipment, and a step of applying heat of temperature qual to or more than a melting point of solder (generally called a molding treatment) when the semiconductor device is soldered onto a printed circuit board. By such a heat treatment, a change in properties (aging) of the metal used in the semiconductor device is promoted with the lapse of time, for example, the resistance value changes. Therefore, in order to form a resistance element having a more accurate resistance value, it is necessary to reduce the resistance-value fluctuations due to the heat treatment after the package process.

Therefore, in the present embodiment, by using, as the lower conductive layer 31, a material having resistance-value fluctuation characteristics opposite to the resistance-value fluctuation characteristics due to the aging of the metal used for the upper conductive layer 32, the resistance-value fluctuations due to the aging is suppressed. Since the resistance-value fluctuations due to the aging is suppressed, the accuracy of the oscillation frequency of the oscillation circuit 8 is improved.

Figure 5:
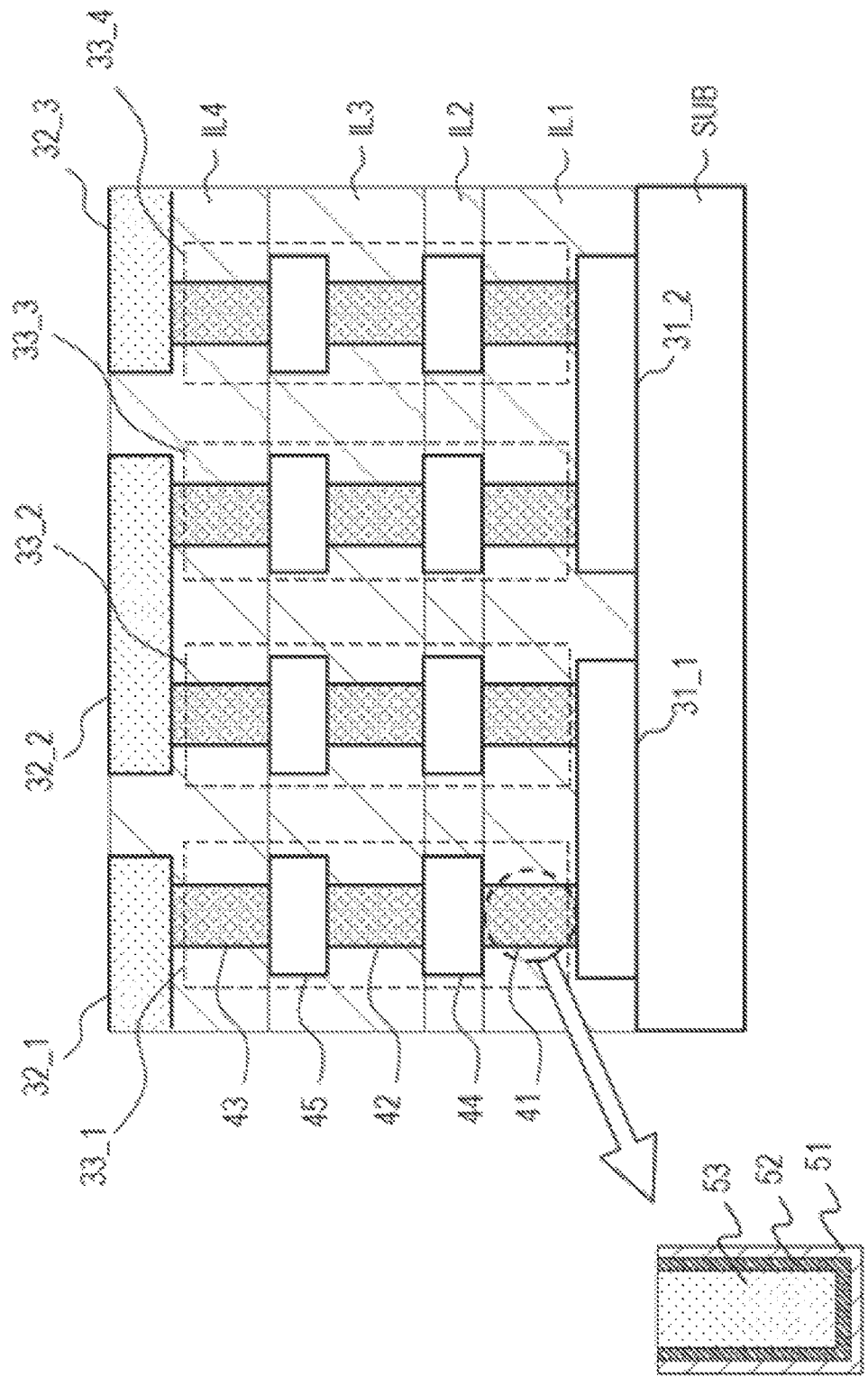
FIG. 5 is a mounting example of the resistance element according to the first embodiment.

FIG. 5 shows a mounting example of the resistance element according to the present embodiment. As described above, a structure of the wiring layers formed in the semiconductor device is used for the resistance element. In the semiconductor device, the interlayer insulating layers IL1 to IL4 are laminated on or over a semiconductor substrate SUB. The lower conductive layer 31 configuring the resistance element 30 is formed in the interlayer insulating layer IL1. The upper conductive layer 32 is formed in the interlayer insulating layer IL4. The interlayer conductive layer 33 is composed of vias 41 to 43 and landing pads 44 and 45 that are formed in the interlayer insulating layers IL1 to IL4. In this way, by forming the interlayer conductive layer 33 over (across) the plurality of interlayer insulating layers, the resistance value of the interlayer conductive layer 33 can be increased as much as possible without complicating the wiring process.

The lower conductive layer 31 is formed of a polysilicon wiring with salicide, and the upper conductive layer 32 is formed of an aluminum-based wiring. The aluminum-based wiring referred to here is a wiring made of a conductive material containing aluminum as a main component (however, a conductive material indicating metal electric power). Each of the landing pads 44 and 45 is formed of, for example, a laminated film of TiN/AlCu/TiN/Ti. Each of the vias 41 to 43 has a structure in which a Ti layer 51 and a TiN layer 52 are deposited and a W (Tungsten) layer 53 is embedded in the deposited layers, and a resistance value of the via is mainly determined by contact resistance between the W layer and the TiN layer. The vias 41 to 43 are formed by embedding metal in via holes formed in the interlayer insulating film, but the vias 41 to 43 are not limited thereto. Any of the vias 41 to 43 may be formed by laminating a resistance material such as metal or polysilicon in advance and filling a space between them with an insulating layer.

As described above, in the present embodiment, the lower conductive layer 31 is formed of the polysilicon wiring with salicide, and the upper conductive layer 32 is formed of the aluminum-based wiring. The resistance value of the polysilicon wiring with salicide fluctuates (varies) positively due to the aging, and the resistance value of the aluminum-based wiring fluctuates negatively due to the aging. Therefore, the resistance-value fluctuations due to the aging can be canceled by the lower conductive layer 31 and the upper conductive layer 32.

Figure 6:
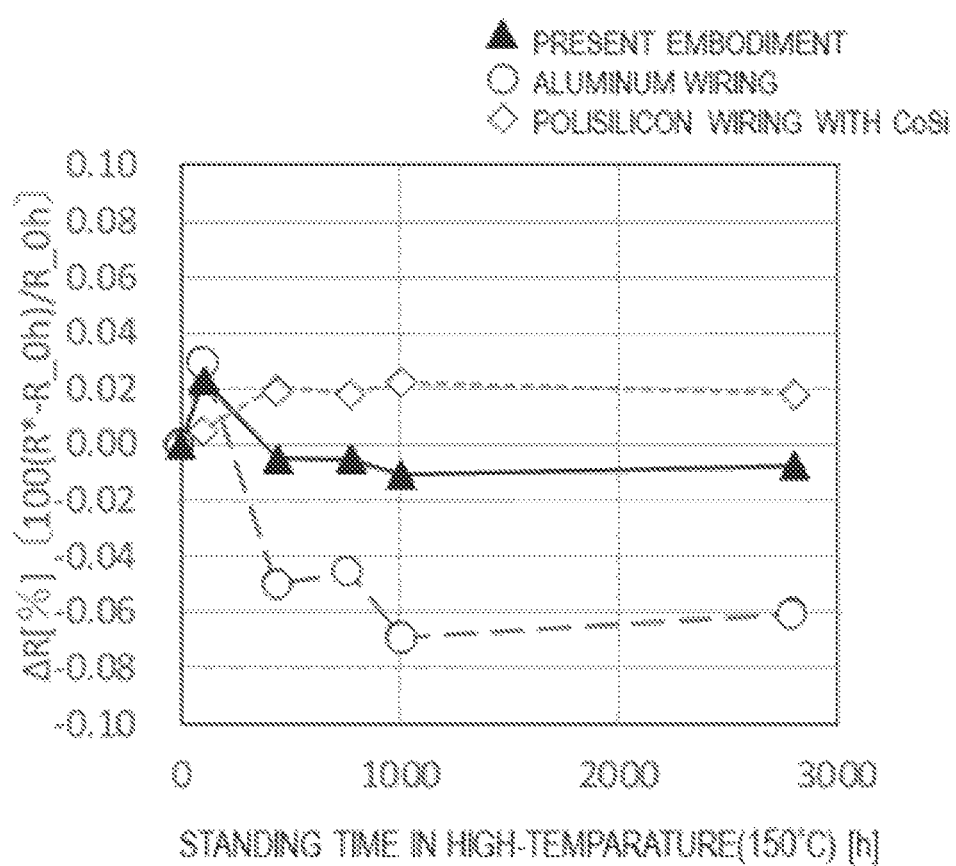
FIG. 6 is a graph showing each resistance-value fluctuation rate due to aging of an aluminum-based wiring and a polysilicon wiring with CoSi.

FIG. 6 shows a resistance-value fluctuation rate due to the aging of the aluminum-based wiring and the polysilicon wiring with salicide. Hereinafter, as an example of the polysilicon wiring with salicide, the polysilicon wiring with CoSi will be described as an example. In FIG. 6, a vertical axis represents a resistance-value fluctuation rate [%], and a horizontal axis represents a high-temperature standing time [h] at 150° C. A black triangle indicates a resistance-value fluctuation rate of the resistance element according to the present embodiment, and a white circle and a white square indicate resistance-value fluctuation rates of the aluminum-based wiring and the polysilicon wiring with CoSi as comparative examples, respectively. In the resistance element shown in FIG. 5, when the aluminum-based wiring is used for the upper conductive layer 32 and the polysilicon wiring with CoSi is used for the lower conductive layer 31 as the polysilicon wiring with salicide, as shown in FIG. 6, the resistance-value fluctuation rate due to the aging is suppressed up to 0.02% or less.

Therefore, according to the present embodiment, formed can be a resistance element that is not easily affected by the package stress and that can reduce the resistance-value fluctuation rate with respect to the heat treatment after the package process.

Figure 7:
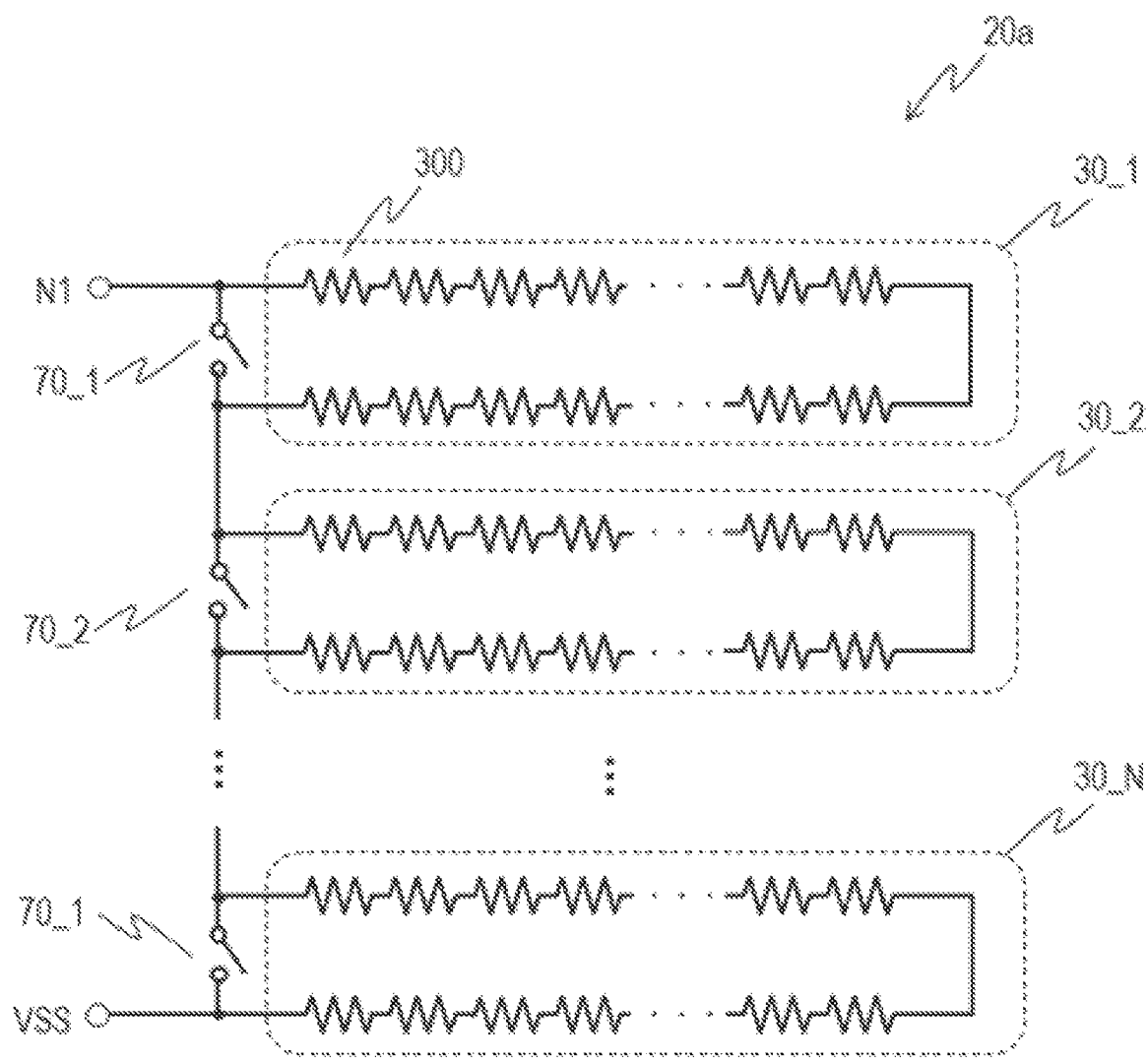
FIG. 7 is a circuit diagram of a variable resistor according to the first embodiment.

FIG. 7 shows a circuit diagram of the variable resistor 20a using the resistance element 30. The variable resistor 20a includes N resistance elements 30 connected in series and a bypass switch 70_i (i=1 to N) provided in parallel with the resistance element 30_i to bypass the resistance elements 30_i (i=1 to N). The resistance element 30 is composed of unit resistors 300 connected in series as shown in FIG. 4. ON/OFF of the bypass switch 70_i is controlled in accordance with the trimming code. The variable resistance 20a is set to a desired resistance value by controlling the bypass switch 70_i, and a potential corresponding to the resistance value appears at a reference potential point N1. Incidentally, since the number of resistance elements 30 connected in series in the present embodiment is large, for example, a yield may be deteriorated due to a defect such as non-conduction. Therefore, a decrease in yield can be prevented by keeping the bypass switch 70_i always ON for the resistance element 30_i in which a manufacturing defect(s) has occurred.

Therefore, according to the variable resistance 20a using the resistance element 30 of the present embodiment, the resistance-value fluctuations due to the aging can be reduced. Therefore, the reduction in the fluctuation makes it possible to improve the accuracy of the oscillation frequency $F_{CKOUT}$ of the oscillation circuit 8 having the trimming circuit 20 provided with the variable resistor 20a.

Second Embodiment

Next, a second embodiment will be described. Also in the second embodiment, an example in which the polysilicon wiring with CoSi is used as the lower conductive layer and the aluminum-based wiring is used as the upper conductive layer will be described similarly to the first embodiment.

Figure 8:
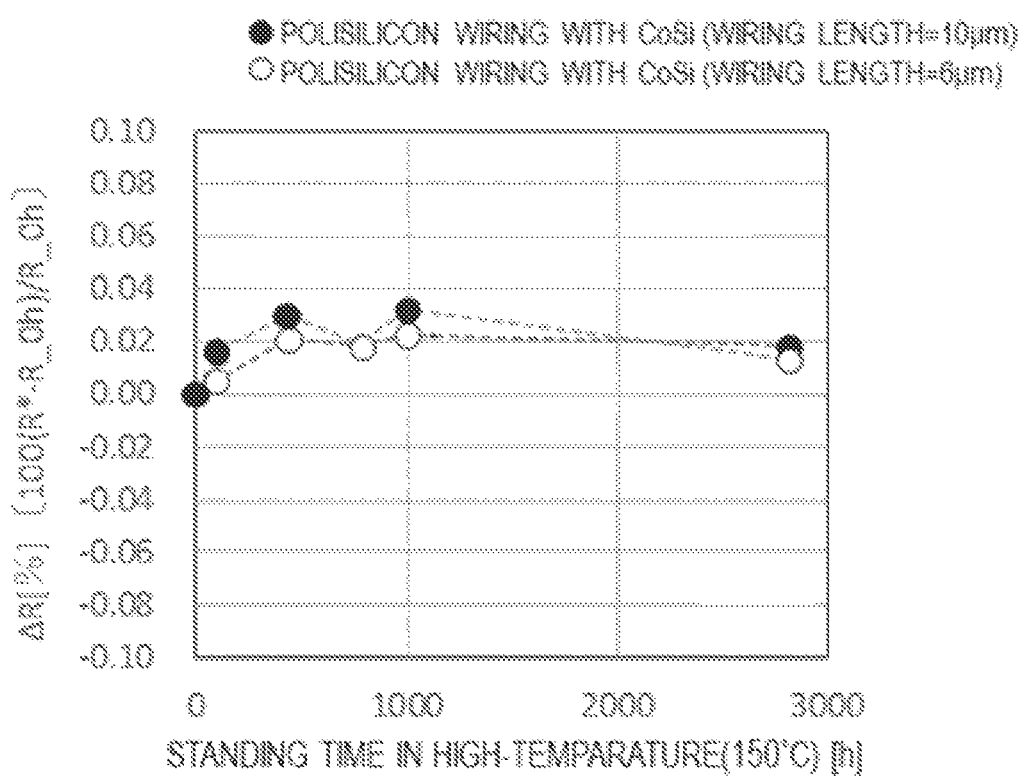
FIG. 8 is a graph showing a resistance-value fluctuation rate of the polysilicon wiring with CoSi.

FIG. 8 shows a characteristic fluctuation (resistance-value fluctuation rate) of a polysilicon wiring with CoSi due to aging caused by an application of heat. A black circle indicates a characteristic fluctuation of a polysilicon wiring with CoSi having a wiring length of 10 μm, and a white circle indicates a characteristic fluctuation of a polysilicon wiring with CoSi having a wiring length of 6 μm. It can be seen from FIG. 8 that the characteristic fluctuation of the polysilicon wiring with CoSi due to aging associated with the heat treatment after the package process does not depend on the wiring length. Therefore, the resistance value of the polysilicon wiring with CoSi is considered to be predominant over the contact resistance with the via. According to FIG. 8, a resistance-value fluctuation rate due to aging of the contact resistance between the polysilicon wiring with CoSi and the via is +0.02%.

Figure 9:
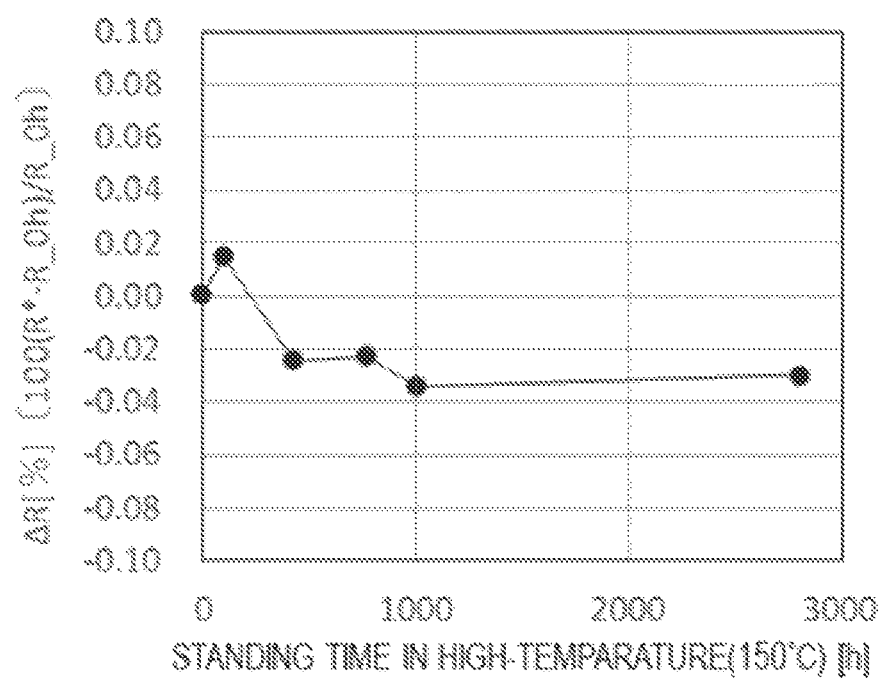
FIG. 9 is a graph showing a resistance-value fluctuation rate due to aging of contact resistance between the aluminum-based wiring and a via.

Meanwhile, FIG. 9 shows a resistance-value fluctuation rate due to the aging of the contact resistance between the aluminum-based wiring and the via. According to FIG. 9, a resistance-value fluctuation rate due to the aging of the contact resistance between the aluminum-based wiring and the via is −0.035%.

Therefore, if it is assumed that a resistance-value fluctuation rate of contact resistance between the polysilicon wiring with CoSi and the via is $\Delta R_{CoSi}$ and a resistance-value fluctuation rate of contact resistance between the aluminum-based wiring and the via is $\Delta R_{AL}$, a fluctuation ratio $\eta_R$ is $\eta_R = |\Delta R_{AL}|/|\Delta R_{CoSi}| = 1.75$. Therefore, a contact area between the polysilicon wiring with CoSi and the via and a contact area between the aluminum-based wiring and the via are designed in consideration of the fluctuation ratio ηR. By doing so, the resistance-value fluctuation rates due to the aging of the polysilicon wiring with CoSi and the aluminum-based wiring are appropriately offset.

Specifically, based on the fluctuation ratio ηR=1.75, the followings may be met:

(resistance value of contact resistance between polysilicon wiring with CoSi and via)/(resistance value of contact resistance between aluminum-based wiring and via)=1.75    (Equation 2).

For its reason, it is desirable to meet:

(contact area between polysilicon wiring with CoSi and via)/(contact area between aluminum-based wiring and via)=1/1.75    (Equation 3).

Figure 10:
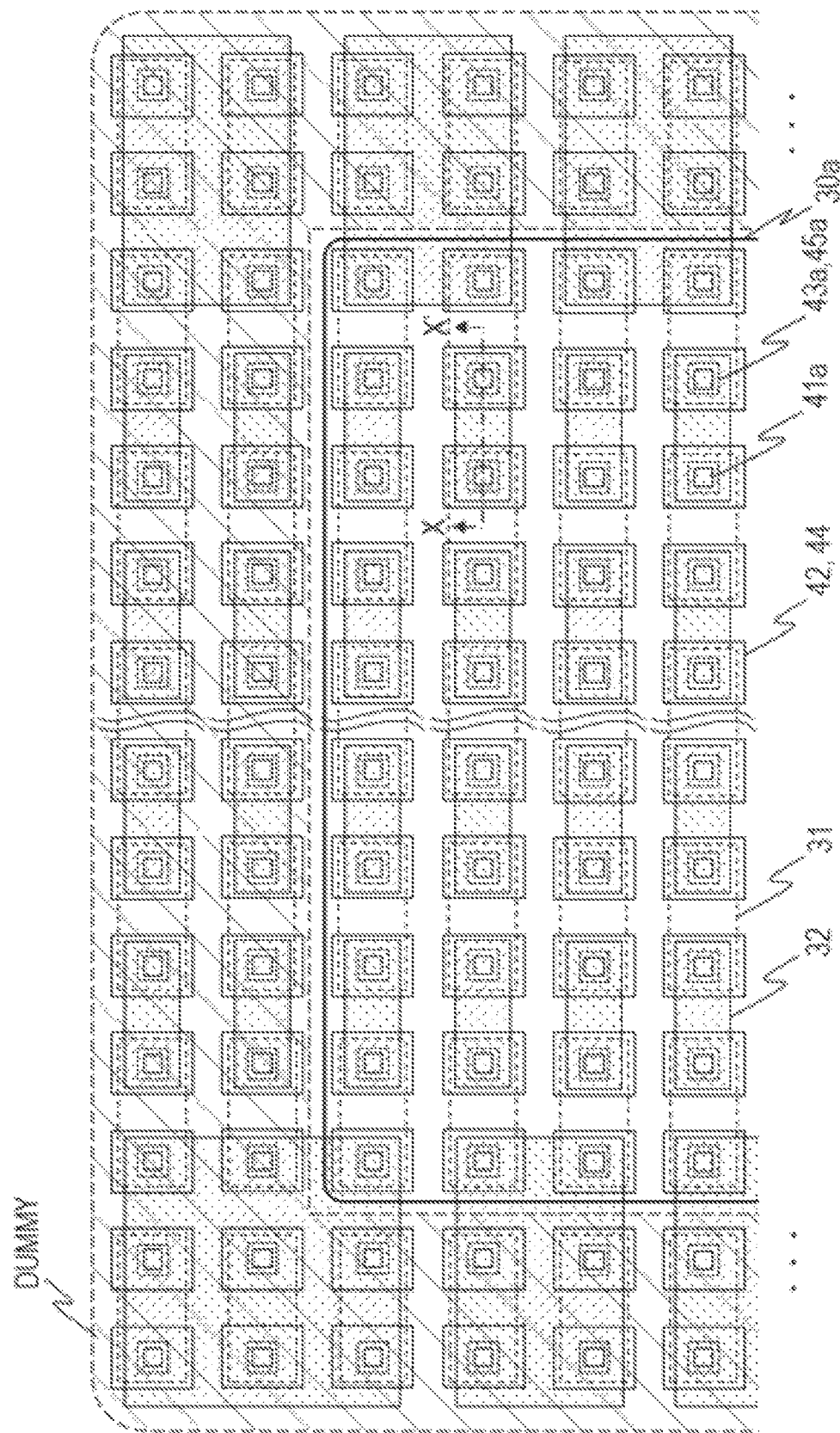
FIG. 10 is a plan view of a resistance element according to a second embodiment.
Figure 11:
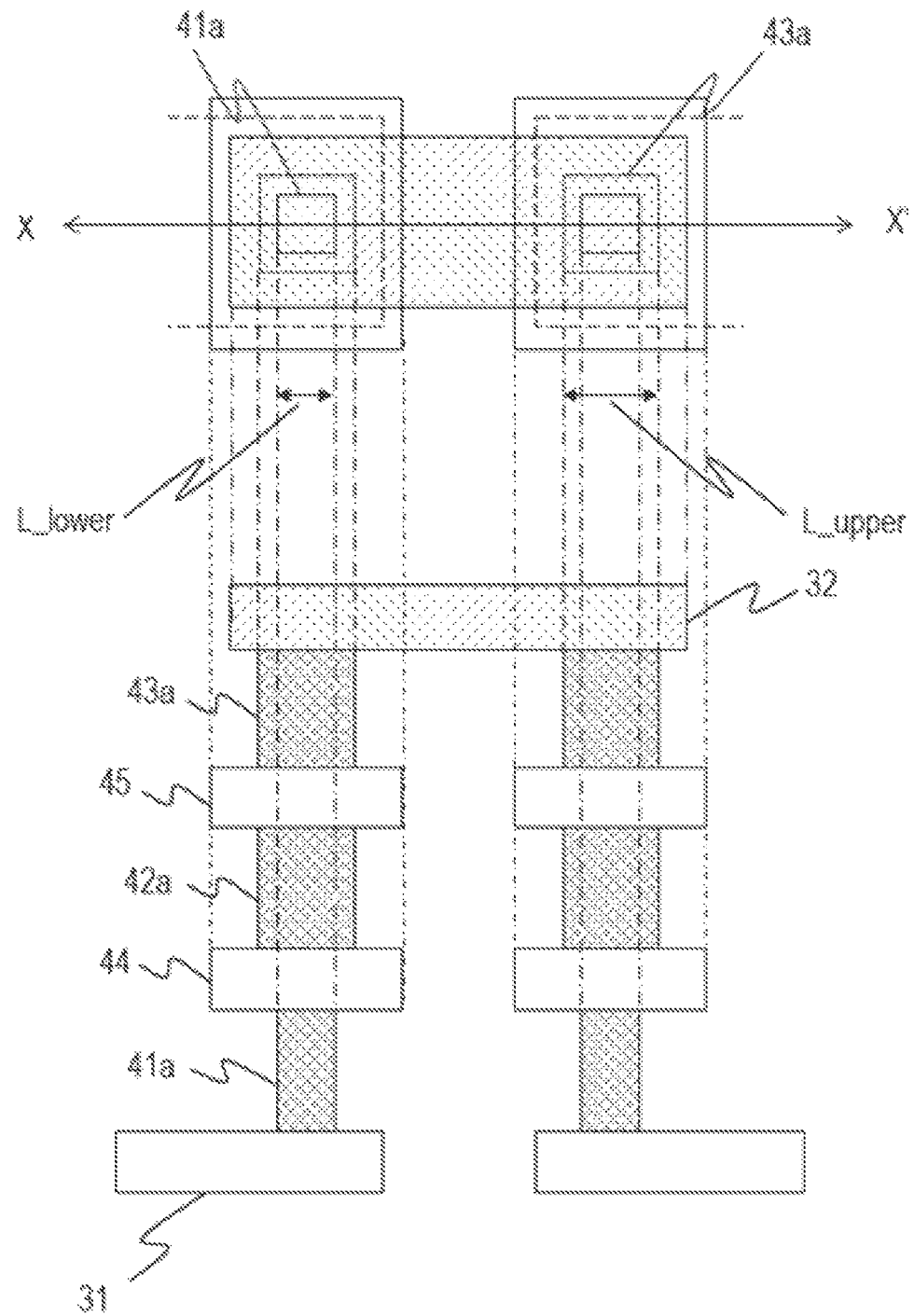
FIG. 11 is a plan view and a sectional view of FIG. 10 taken along line X-X'.

FIG. 10 is a plan view of the resistance element 30a formed in consideration of the fluctuation ratio ηR. FIG. 11 shows a plan view and a sectional view taken along line X-X' of FIG. 10. The resistance element 30a includes a lower conductive layer 31, vias 41a to 43a forming the interlayer conductive layer 33, landing pads 44 and 45, and the upper conductive layer 32, all of which are formed on a plurality of interlayer insulating layers (not shown). The lower conductive layer is a polysilicon wiring with Cosi, and the upper conductive layer 32 is an aluminum-based wiring. As shown in FIG. 10, a contact area between the lower conductive layer 31 and the via 41a is smaller than a contact area between the via 43a and the upper conductive layer 32. A cross-section of the via is generally formed into a square shape as shown in FIG. 11. If it is assumed that a length of one side of the via 41a is L_lower and a length of one side of the via 43a is L_upper, in order to satisfy Equation 3, the following relationship may be met:

$L\_upper = 1.32 \times L\_lower$    (Equation 4).

That is, if a sectional area of the via 43a is formed larger than a sectional area of the via 41a so as to satisfy Equation 4, the resistance-value fluctuations due to the aging of the polysilicon wiring with CoSi as the lower conductive layer 31 and the aluminum-based wiring as the upper conductive layer 32 can be appropriately offset.

Incidentally, in FIG. 10, a dummy pattern DUMMY (hatched area) having the same pattern as that of unit resistors configuring the resistance element 30a is arranged around the resistance element 30a. Respective shapes of the vias tend to vary when the vias are formed in an outer peripheral portion of a pattern in which a large number of contacts and vias are densely formed like the resistance element 30a. Therefore, arranging the dummy pattern on the outer peripheral portion makes it possible to reduce variations in shapes of the contacts and vias in a region of the resistance element 30a that functions as a resistance element. As a result, it is possible to secure an area ratio of their contact portions with high accuracy in the resistance element 30a, and to more appropriately suppress the resistance-value fluctuations due to the aging.

Third Embodiment

Figure 12:
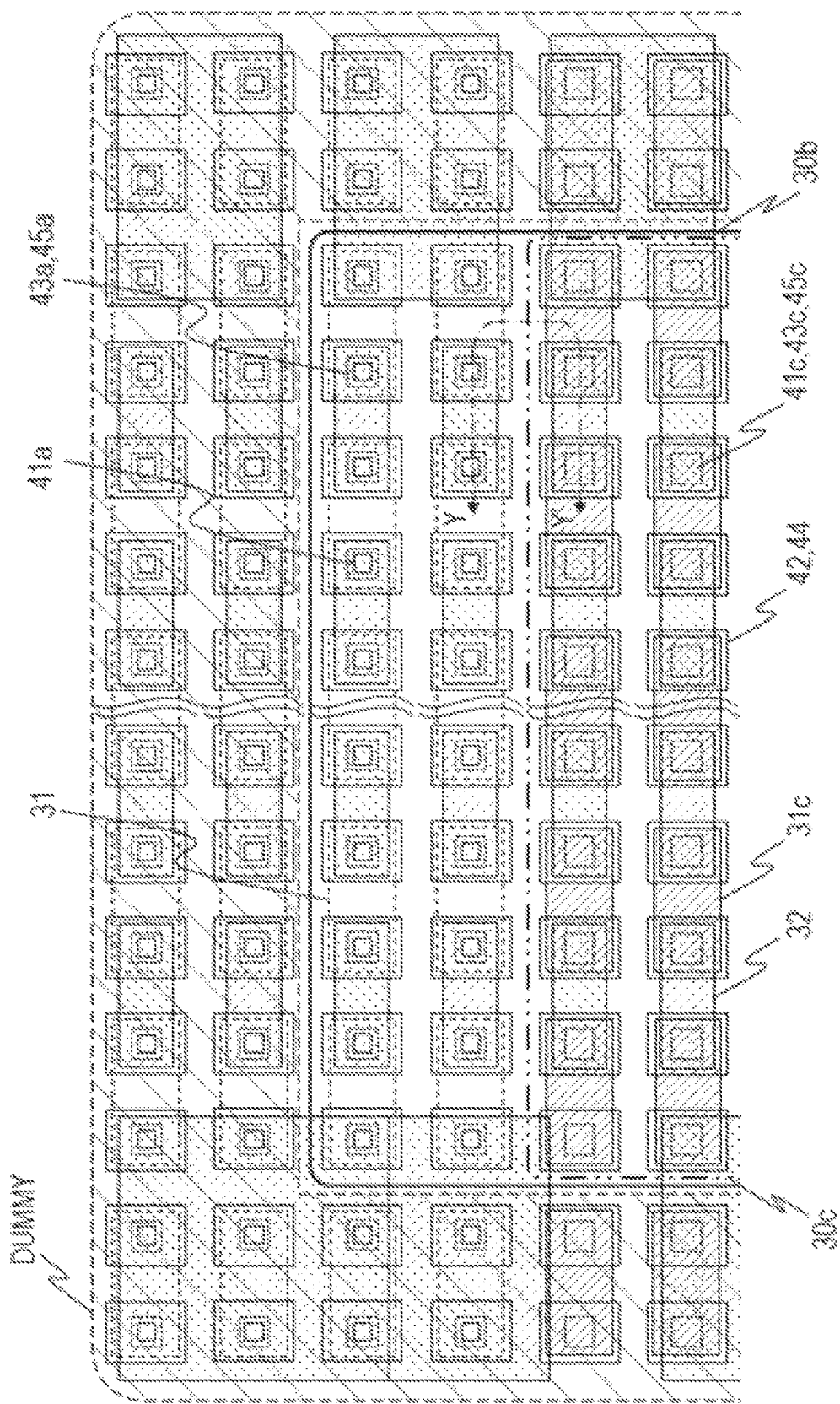
FIG. 12 is a plan view of a resistance element according to a third embodiment.
Figure 13:
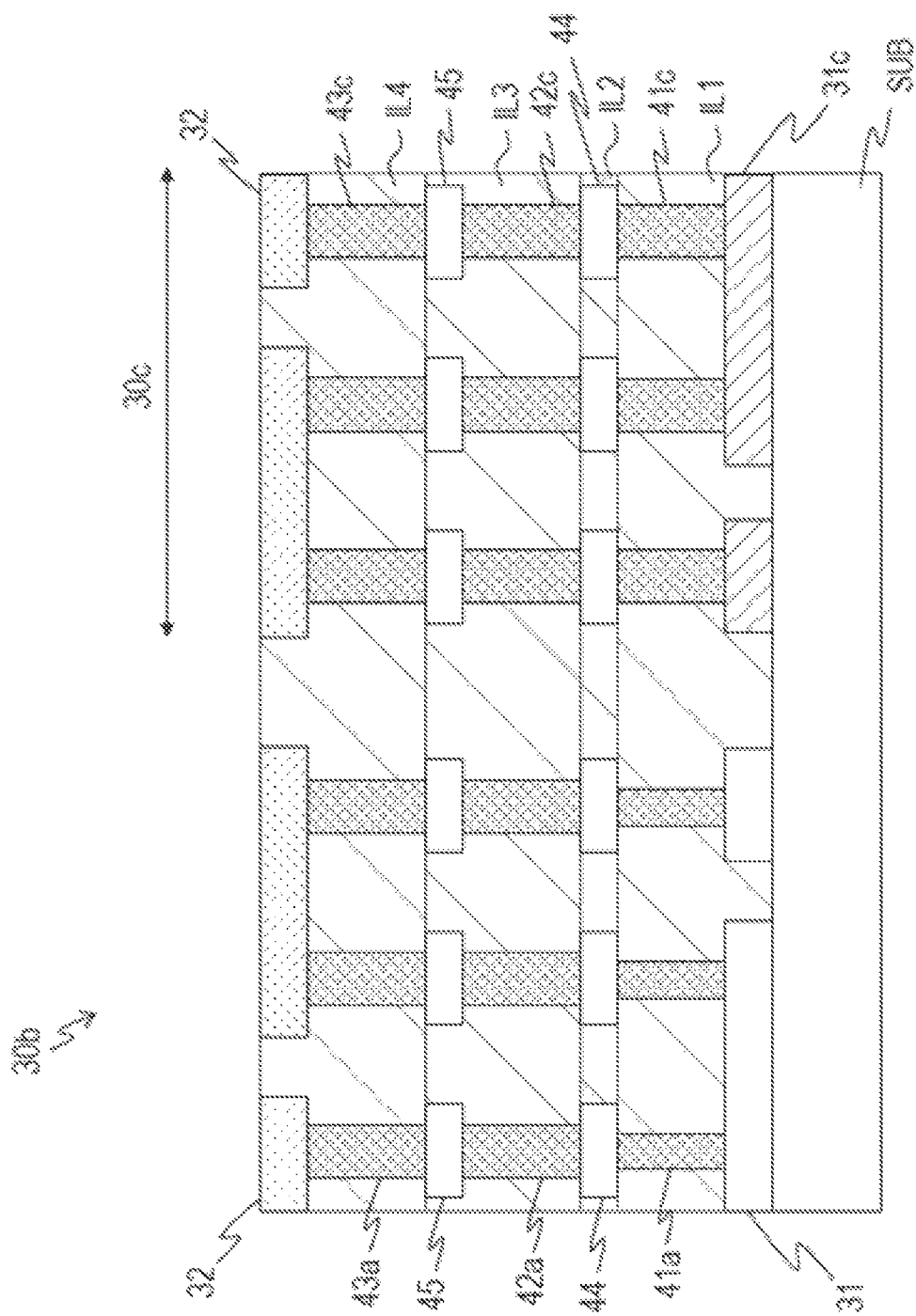
FIG. 13 is a sectional view taken along line Y-Y' of FIG. 12.

FIGS. 12 and 13 show a third embodiment. FIG. 12 is a plan view of a resistance element 30b of a third embodiment, and FIG. 13 is a sectional view taken along line Y-Y' of FIG. 12. In the third embodiment, in order to satisfy the relationship (Equation 2) between the resistance value of the contact resistance between the polysilicon wiring with CoSi and the via and the resistance value of the contact resistance between the aluminum-based wiring and the via based on the fluctuation ratio ηR, a metal wiring such as tungsten wiring or aluminum-based wiring is used in place of the polysilicon wiring with CoSi for the lower conductive layer of some of the unit resistors configuring the resistance element. That is, used for the lower conductive layer of some of the unit resistors configuring the resistance element is a metal wiring having a resistance-value fluctuation characteristic that fluctuates in the same direction as that of the resistance-value fluctuations due to the aging of the upper conductive layer.

As shown in FIGS. 12 and 13, a unit resistance group formed in a region 30c of the resistance element 30b is configured by: the lower conductive layer 31c made of a metal wiring such as a tungsten wiring or an aluminum wiring; and the upper conductive layer 32 composed of the vias 41c to 43c, landing pads 44 and 45, and aluminum-based wiring that configure the interlayer conductive layer 33. The lower conductive layer 31c is formed on the interlayer insulating layer IL1 formed on (over) the semiconductor substrate SUB, and the upper conductive layer 32 is formed on the interlayer insulating layer IL4 above the interlayer insulating layer IL1. The vias 41c to 43c and the landing pads 44 and 45 are formed in the interlayer insulating layers IL1 to IL4.

In this way, by using the metal wiring such as a tungsten wiring or an aluminum-based wiring instead of the polysilicon wiring with CoSi for the lower conductive layer of some of the unit resistors configuring the resistance element the resistance value of the contact resistance between the silicon wiring with CoSi and the via and the resistance value of the contact resistance between the aluminum wiring and the via can be adjusted so as to satisfy (Equation 2). As a result, the resistance-value fluctuations due to the aging of the polysilicon wiring with CoSi and the aluminum-based wiring can be appropriately offset.

For example, if a resistance value of contact resistance between the polysilicon wiring with CoSi and each via is higher than a resistance value of contact resistance between the aluminum-based wiring and the via, the resistance-value fluctuations due to the aging may not be sufficiently offset in the resistance element 30b which applies the polysilicon wiring with CoSi to the lower conductive layer of all the unit resistors. In that case, similarly to the third embodiment, by using a metal wiring such as a tungsten wiring or an aluminum-based wiring for the lower conductive layer of some of the unit resistors configuring the resistance element instead of the polysilicon wiring with CoSi, the resistance element meeting (Equation 2) may be formed. Incidentally, although the sectional area of the via 41a is shown to be smaller than those of the vias 43a and 45a in FIG. 12, the sectional area of the via 41a may be the same as those of the vias 42a and 43a if meting (Equation 2).

Further, in the third embodiment, the metal wiring such as a tungsten wiring or an aluminum-based wiring is used instead of the polysilicon wiring with CoSi for the lower conductive layer of some of the unit resistors configuring the resistance element. However, when the contact resistance between the aluminum-based wiring and the via needs to be reduced in order to satisfy (Equation 2), for example, the number of wiring layers made of an aluminum-based wiring may be reduced.

In addition, the dummy pattern DUMMY may be arranged around the resistance element 30b similarly to FIG. 10. Arranging the dummy pattern around the resistance element 30b makes it possible to reduce the variations in the shapes of the contacts and vias of the resistance element 30b. Therefore, the resistance-value fluctuations due to the aging can be suppressed more appropriately.

Figure 14:
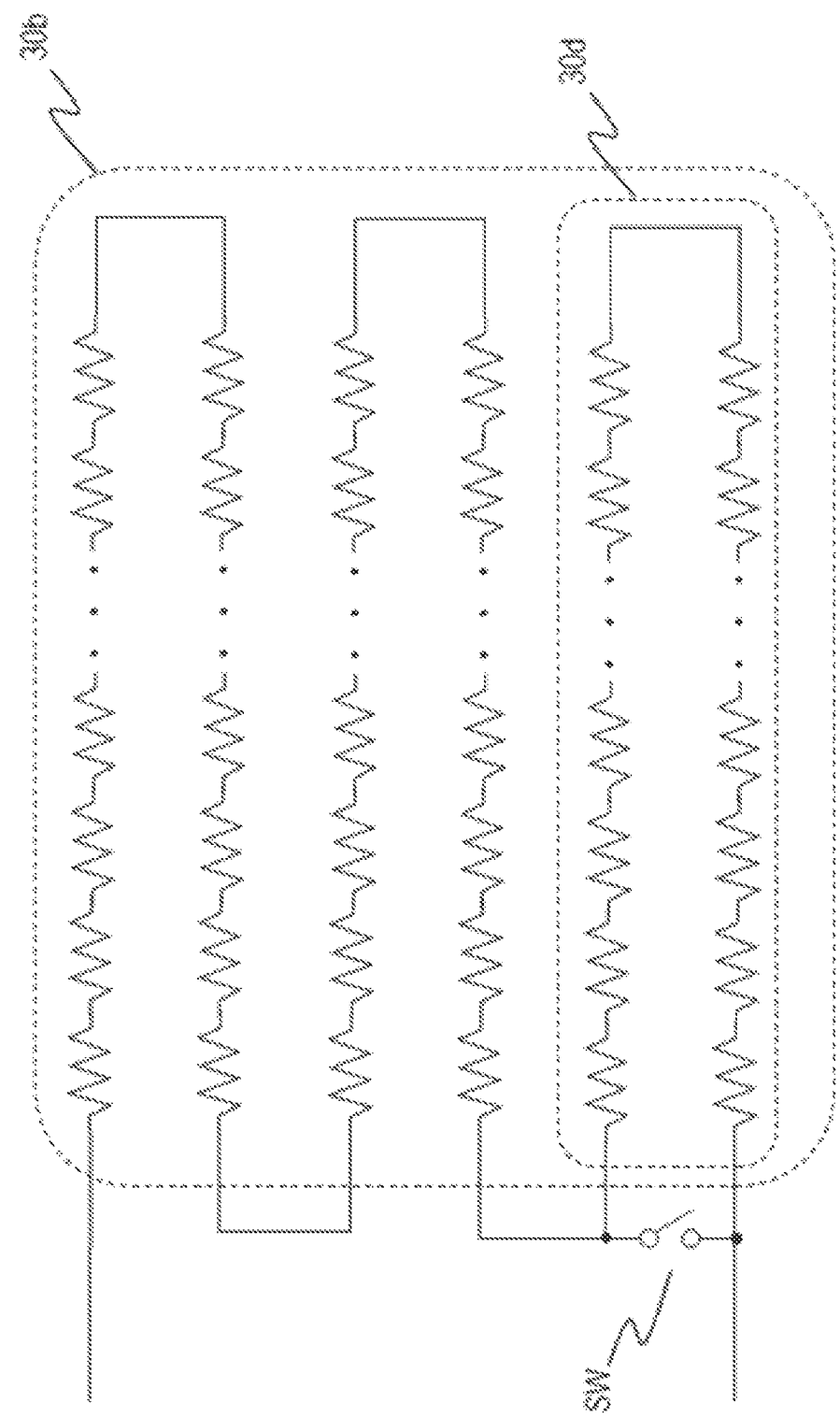
FIG. 14 is a circuit diagram of the resistance element according to the third embodiment.

Incidentally, the plurality of unit resistors formed in the region 30c of the resistance element 30b shown in FIG. 12 and using the metal wiring such as a tungsten wiring or an aluminum-based wiring as the lower conductive layer can be used as a relief resistance element 30d. As shown in FIG. 14, the relief resistance element 30d is connected in parallel with the switch SW. The resistance value of the resistance element 30b can be adjusted by turning the switch SW on or off. Therefore, the resistance value of the resistance element can be corrected while the trimming circuit 20 is actually used.

Although the invention made by the present inventors has been specifically described based on the embodiments, it is needless to say that the invention is not limited to the embodiments and can be variously changed and modified without departing from the gist thereof. For example, the third embodiment can be combined with the second embodiment. Further, for example, the first embodiment may use an aluminum-based wiring for the lower conductive layer, and use a polysilicon wiring with salicide for the upper conductive layer. Furthermore, the lower conductive layer and the upper conductive layer are not limited to the aluminum-based wiring and the polysilicon wiring with CoSi, and may use other materials as long as wirings is made of materials in which resistance-value fluctuations thereof due to heat are opposite to each other.

Figure 15:
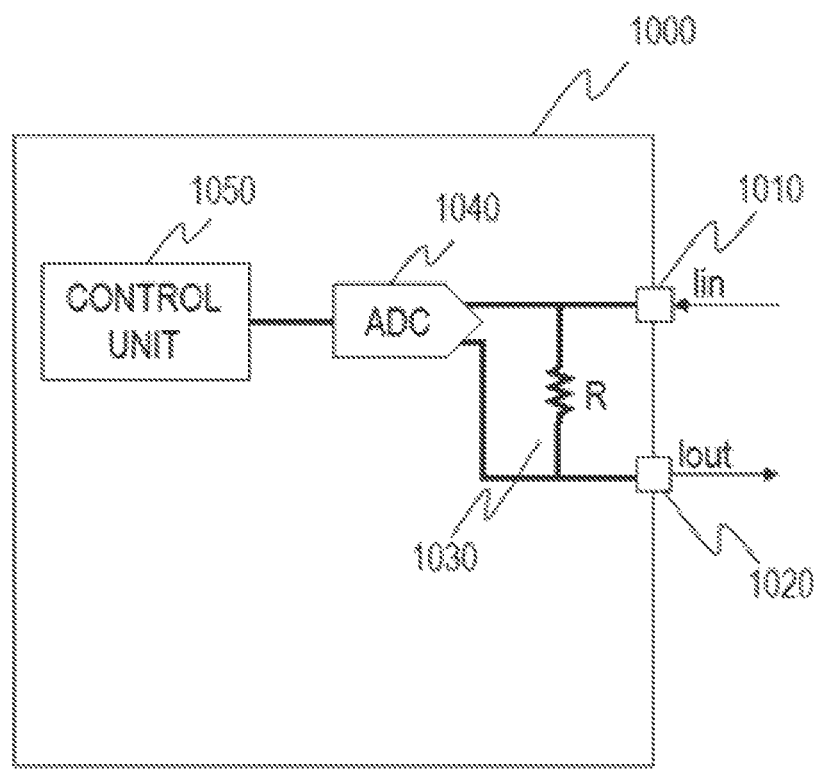
FIG. 15 is a block diagram of a linear solenoid drive circuit.

In addition, what the resistance element of the present embodiment is applied to is not limited to the oscillation circuit, and may be a semiconductor device 1000 mounting a linear solenoid drive circuit shown in FIG. 15. An inductor (not shown) is connected between a terminal 1010 and a terminal 1020 of the semiconductor device 1000. By passing a current through the inductor, a magnetic field corresponding to magnitude of the current is generated. At this time, the current flowing through the inductor is monitored by a voltage generated across a resistor 1030 connected between the terminals 1010 and 1020. The voltage generated across the resistor 1030 is detected by using an A/D converter 1040 and is fed back to a control circuit 105. Since the trimming circuit using the resistance element of the present embodiment is applied also to the resistor 1030, the current flowing through the inductor can be accurately controlled.

What is claimed is:

1. A semiconductor device comprising:
   a semiconductor substrate: and
   a conductor having a repeating pattern of:
      a first conductive layer pattern formed in a first interlayer insulating layer formed over the semiconductor substrate;
      a second conductive layer pattern formed in a second interlayer insulating layer different from the first interlayer insulating layer; and
      an interlayer conductive layer pattern connecting the first conductive layer pattern and the second conductive layer pattern,
   wherein the first conductive layer pattern is formed of a material different from that of the second conductive layer pattern, and
   the first conductive layer pattern has a resistance-value fluctuation characteristic opposite to a resistance-value fluctuation characteristic of the second conductive layer pattern after a heat treatment.

2. The semiconductor device according to claim 1, wherein a resistance value of the interlayer conductive layer pattern is larger than a sum of a resistance value of the first conductive layer pattern and a resistance value of the second conductive layer pattern.

3. The semiconductor device according to claim 1, further comprising a third interlayer insulating layer formed between the first interlayer insulating layer and the second interlayer insulating layer,
   wherein the interlayer conductive layer pattern has a landing pad formed in the third interlayer insulating layer, a first via connecting the first conductive layer pattern and the landing pad, and a second via connecting the second conductive layer pattern and the landing pad.

4. The semiconductor device according to claim 3,
wherein a contact area between the first via and the first conductive layer pattern and a contact area between the second via and the second conductive layer pattern are different from each other.

5. The semiconductor device according to claim 1,
wherein one of the first conductive layer pattern and the second conductive layer pattern is an aluminum-based wiring, and
the other of the first conductive layer pattern and the second conductive layer pattern is a polysilicon wiring with salicide.

6. The semiconductor device according to claim 1,
wherein the interlayer conductive layer pattern is a first interlayer conductive layer pattern,
the repeating pattern is a first repeating pattern,
the conductor further includes a second repeating pattern that is a repeating pattern of: a third conductive layer pattern formed in the first interlayer insulating layer; a fourth interlayer conductive layer pattern formed in the second interlayer insulating layer; and a second conductive layer pattern connecting the third conductive layer pattern and the fourth conductive layer pattern, and
the third conductive layer pattern and the fourth conductive layer pattern have resistance-value fluctuation characteristics opposite to a resistance-value fluctuation characteristic of the first conductive layer pattern after a heat treatment.

7. The semiconductor device according to claim 6,
wherein the third conductive layer pattern is an aluminum-based wiring, and
the fourth conductive layer pattern is a tungsten wiring or an aluminum-based wiring.

8. A semiconductor device comprising a trimming circuit including:
a plurality of resistance elements connected in series between a first end and a second end; and
a plurality of switches, each of the switches being connected in parallel with each of the resistance elements, and ON/OFF of each of the switches being controlled in accordance with a trimming cord corresponding to each of the resistance elements,
wherein each of the resistance elements comprises the conductor according to claim 1.

9. The semiconductor device according to claim 8, further comprising an oscillation circuit that outputs an oscillation signal having an oscillation frequency corresponding to a potential at the first end.

10. A Semiconductor device comprising a linear solenoid drive circuit, the linear solenoid drive circuit including:
a first terminal and a second terminal to which an inductor is connected;
a resistance element connected between the first terminal and the second terminal;
an A/D converter that inputs a voltage generated across both ends of the resistance element; and
a control circuit controlling a current flowing through the inductor based on a result of the A/D converter,
wherein the resistance element is composed of the conductor according to claim 1.

11. A semiconductor device comprising:
a semiconductor substrate; and
a resistance element having a plurality of unit resistors, each of the unit resistors including: a first conductive layer pattern provided in a first interlayer insulating layer formed on the semiconductor substrate; a second conductive layer pattern provided in a second interlayer insulating layer different from the first interlayer insulating layer; and an interlayer conductive layer formed between the first interlayer insulating layer and the second interlayer insulating layer and connecting the first conductive layer pattern and the second conductive layer pattern, the resistance element being configured by connecting the unit resistors in series,
wherein a resistance-value fluctuation characteristic due to aging of a material of the second conductive layer pattern has a characteristic opposite to a resistance-value fluctuation characteristic due to aging of a material of the first conductive layer pattern.

12. The semiconductor device according to claim 11,
wherein the interlayer conductive layer contains metal or polysilicon embedded in a via hole that is formed in a third interlayer insulating layer formed between the first interlayer insulating layer and the second interlayer insulating layer.

13. The semiconductor device according to claim 11,
wherein one of the first conductive layer pattern and the second conductive layer pattern is an aluminum-based wiring, and
the other of the first conductive layer pattern and the second conductive layer pattern is a polysilicon wiring with salicide.

* * * * *